(12) United States Patent  
Petrarca et al.

(10) Patent No.: US 9,293,375 B2  
(45) Date of Patent: Mar. 22, 2016

(54) SELECTIVELY GROWN SELF-ALIGNED FINS FOR DEEP ISOLATION INTEGRATION

(71) Applicant: International Business Machines Corporation, Armonk, NY (US)

(72) Inventors: Kevin S. Petrarca, Newburgh, NY (US); Stuart A. Sieg, Albany, NY (US); Theodorus E. Standaert, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/260,724

(22) Filed: Apr. 24, 2014

(65) Prior Publication Data

US 2015/0311121 A1    Oct. 29, 2015

(51) Int. Cl.  
*H01L 23/48* (2006.01)  
*H01L 23/52* (2006.01)  
*H01L 29/40* (2006.01)  
*H01L 21/8234* (2006.01)  
*H01L 29/66* (2006.01)  
*H01L 21/762* (2006.01)  
*H01L 21/306* (2006.01)  
*H01L 21/3105* (2006.01)  
*H01L 21/308* (2006.01)  
*H01L 21/311* (2006.01)  
*H01L 21/02* (2006.01)  
*H01L 29/78* (2006.01)  
*H01L 21/033* (2006.01)  
*H01L 27/092* (2006.01)

(52) U.S. Cl.  
CPC .. *H01L 21/823431* (2013.01); *H01L 21/02123* (2013.01); *H01L 21/0337* (2013.01); *H01L 21/3081* (2013.01); *H01L 21/30604* (2013.01); *H01L 21/31051* (2013.01); *H01L 21/31111* (2013.01); *H01L 21/76224* (2013.01); *H01L 21/823481* (2013.01); *H01L 27/0924* (2013.01); *H01L 29/6656* (2013.01); *H01L 29/66795* (2013.01); *H01L 29/785* (2013.01)

(58) Field of Classification Search  
CPC ............ H01L 29/66795; H01L 29/785; H01L 21/823821; H01L 21/0337; H01L 27/0924  
See application file for complete search history.

(56) References Cited

U.S. PATENT DOCUMENTS

| 6,969,659 | B1 | 11/2005 | Anderson et al. |
| 7,023,055 | B2 | 4/2006 | Ieong et al. |
| 7,087,471 | B2 | 8/2006 | Beintner |
| 7,176,067 | B2 | 2/2007 | Jung et al. |

(Continued)

FOREIGN PATENT DOCUMENTS

WO    WO2013095651    6/2013

*Primary Examiner* — Howard Weiss  
(74) *Attorney, Agent, or Firm* — Scully, Scott, Murphy & Presser, P.C.; Steven J. Meyers

(57) ABSTRACT

A trench isolation structure is formed beneath a topmost surface of a semiconductor substrate. A mandrel structure having a bottommost surface that straddles a sidewall edge of the underlying trench isolation structure is then formed. Nitride spacers are formed on sidewalls of the mandrel structure and thereafter the mandrel structure is removed. A dielectric oxide material is then formed having a topmost surface that is coplanar with a topmost surface of each remaining nitride spacer. Each nitride spacer is removed and thereafter a semiconductor fin is epitaxially grown within a cavity in the dielectric oxide material which exposes a topmost surface of the semiconductor substrate.

20 Claims, 6 Drawing Sheets

(56) References Cited

U.S. PATENT DOCUMENTS

| | | | |
|---|---|---|---|
| 7,198,995 B2 | 4/2007 | Chidambarrao et al. | |
| 7,329,923 B2 | 2/2008 | Doris et al. | |
| 7,394,117 B2 | 7/2008 | Jung et al. | |
| 7,553,767 B2 * | 6/2009 | Cho et al. | 438/689 |
| 7,655,533 B2 | 2/2010 | Sheen et al. | |
| 7,667,271 B2 | 2/2010 | Yu et al. | |
| 7,700,466 B2 * | 4/2010 | Booth et al. | 438/517 |
| 7,727,830 B2 | 6/2010 | Jin et al. | |
| 7,851,340 B2 | 12/2010 | Brownson et al. | |
| 7,871,873 B2 | 1/2011 | Maszara et al. | |
| 7,872,303 B2 | 1/2011 | Chan et al. | |
| 8,034,677 B2 | 10/2011 | Lin et al. | |
| 8,043,920 B2 | 10/2011 | Chan et al. | |
| 8,053,299 B2 | 11/2011 | Xu | |
| 8,058,692 B2 | 11/2011 | Lai et al. | |
| 8,110,458 B2 | 2/2012 | Jin et al. | |
| 8,178,921 B2 | 5/2012 | Sheen et al. | |
| 8,207,038 B2 | 6/2012 | Cheng et al. | |
| 8,227,304 B2 | 7/2012 | Iyer et al. | |
| 8,350,269 B2 | 1/2013 | Iyer et al. | |
| 8,362,574 B2 | 1/2013 | Kawasaki et al. | |
| 8,410,544 B2 | 4/2013 | Chan et al. | |
| 8,420,471 B2 | 4/2013 | Anderson et al. | |
| 8,441,072 B2 | 5/2013 | Tsai et al. | |
| 8,455,321 B2 | 6/2013 | Lai et al. | |
| 8,466,012 B1 | 6/2013 | Chang et al. | |
| 8,492,228 B1 | 7/2013 | Leobandung et al. | |
| 8,497,171 B1 | 7/2013 | Wu et al. | |
| 8,497,177 B1 | 7/2013 | Chang et al. | |
| 2005/0116290 A1 | 6/2005 | De Souza et al. | |
| 2011/0163354 A1 | 7/2011 | Wells et al. | |
| 2012/0025316 A1 | 2/2012 | Schultz | |
| 2013/0234204 A1 | 9/2013 | Kang et al. | |
| 2015/0035081 A1 * | 2/2015 | Cheng et al. | 257/401 |

* cited by examiner

SELECTIVELY GROWN SELF-ALIGNED FINS FOR DEEP ISOLATION INTEGRATION

BACKGROUND

The present application relates to semiconductor device manufacturing, and more particularly to a method of forming a deep trench isolation structure in a semiconductor material portion of a semiconductor substrate and thereafter epitaxially growing semiconductor fins on selected areas of a topmost surface of the semiconductor substrate.

The use of non-planar semiconductor devices such as, for example, finFETs, trigate and gate-all around semiconductor nanowire field effect transistors (FETs) is the next step in the evolution of complementary metal oxide semiconductor (CMOS) devices. Current process flow for trench isolation structure formation for future technology nodes including, finFETs, are restricted by the fundamental limits of the lithographic process. Moreover, current process flows are further restricted by semiconductor fin and trench isolation structure tapering through reactive ion etching since prior art processes cut the semiconductor fin after it is already formed in a semiconductor material.

In view of the above, a process is needed that seeks to remove the taper component variation impact on technology process assumptions.

SUMMARY

A trench isolation structure is formed beneath a topmost surface of a semiconductor substrate. A mandrel structure having a bottommost surface that straddles a sidewall edge of the underlying trench isolation structure is then formed. Nitride spacers are formed on sidewalls of the mandrel structure and thereafter the mandrel structure is removed. A dielectric oxide material is then formed having a topmost surface that is coplanar with a topmost surface of each remaining nitride spacer. Each nitride spacer is removed and thereafter a semiconductor fin is epitaxially grown within a cavity in the dielectric oxide material which exposes a topmost surface of the semiconductor substrate. Since the trench isolation structure is formed prior to formation of the semiconductor fin, the tapering cut no longer is included in the process assumptions and only the top critical dimension variation of the trench isolation structure will impact process variation.

In one aspect of the present application, a method of forming a semiconductor structure is provided. In one embodiment, the method of the present application includes providing a trench isolation structure in a semiconductor substrate. Next, a mandrel structure having a first portion located above the semiconductor substrate and a second portion located above the trench isolation structure is formed. In accordance with the present application, a bottommost surface of the mandrel structure straddles a sidewall edge of the trench isolation structure. After mandrel structure formation, a nitride spacer is formed on each sidewall of the mandrel structure. Thereafter, the mandrel structure is removed selective to the nitride spacers. Next, a dielectric oxide material having a topmost surface that is coplanar with a topmost surface of the nitride spacers is formed. One of nitride spacers is removed to provide a cavity exposing a portion of a topmost surface of the semiconductor substrate and another of the nitride spacers is removed to provide another cavity exposing a portion of the topmost surface of the trench isolation structure. A semiconductor fin is then epitaxially grown in the cavity that exposes the portion of the topmost surface of the semiconductor substrate, but not in the another cavity that exposes the portion of the topmost surface of the trench isolation structure.

In another embodiment, the method includes providing a structure including a hard mask material stack comprising from bottom to top, an oxide hard mask layer and a nitride hard mask layer on a topmost surface of a semiconductor substrate. An opening is then formed entirely through the hard mask material stack and partially through the semiconductor substrate. A trench isolation structure is formed in the opening, wherein the trench isolation structure has a topmost surface that is coplanar with a topmost surface of remaining portions of the nitride hard mask layer. Next, the remaining portions of the nitride hard mask layer are removed to expose remaining portions of the oxide hard mask layer. A screen oxide layer is then formed on each of the remaining portions of the oxide hard mask layer and the topmost surface of the trench isolation structure. After forming the screen oxide layer, a mandrel structure having a first portion located above the semiconductor substrate and a second portion located above the trench isolation structure is formed on the screen oxide layer, wherein a bottommost surface of the mandrel structure straddles a sidewall edge of the trench isolation structure. A nitride spacer is formed on each sidewall of the mandrel structure and then the mandrel structure is removed selective to the nitride spacers. A dielectric oxide material having a topmost surface that is coplanar with a topmost surface of the nitride spacers is formed and thereafter one of nitride spacers is removed to provide a cavity exposing a portion of the screen oxide layer located above the topmost surface of the semiconductor substrate and another of the nitride spacers is removed to provide another cavity exposing another portion of the screen oxide layer located above the topmost surface of the trench isolation structure. The cavity is then extended to expose the topmost surface of the semiconductor substrate, and the another cavity is extended to expose the topmost surface of the trench isolation structure. A semiconductor fin is epitaxially grown in the cavity that exposes the portion of the topmost surface of the semiconductor substrate, but not in the another cavity that exposes the portion of the topmost surface of the trench isolation structure.

DETAILED DESCRIPTION

Figure 1:
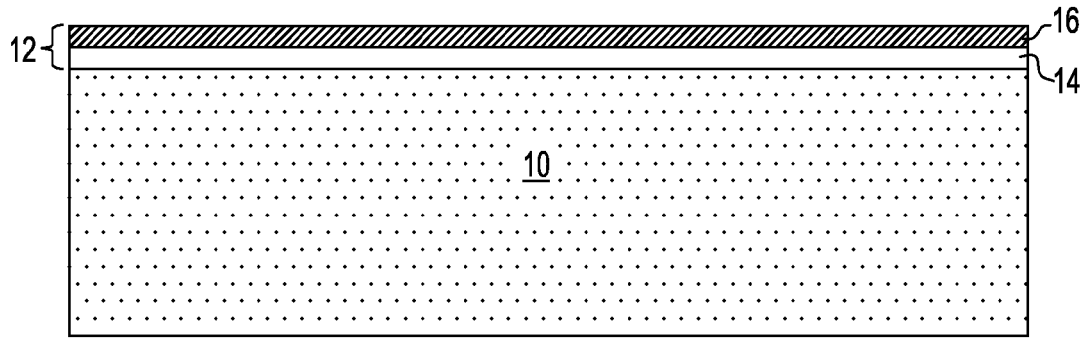
FIG. 1 is a vertical cross sectional view of a first exemplary semiconductor structure including a hard mask material stack comprising, from bottom to top, an oxide hard mask layer and a nitride hard mask layer located on a topmost surface of a semiconductor substrate that can be employed in one embodiment of the present application.

The present disclosure will now be described in greater detail by referring to the following discussion and drawings that accompany the present disclosure. It is noted that the drawings of the present disclosure are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present disclosure. However, it will be appreciated by one of ordinary skill in the art that the various embodiments of the present disclosure may be practiced without these specific details. In other instances, well-known structures or processing steps have not been described in detail in order to avoid obscuring the present disclosure.

Referring first to FIG. 1, there is illustrated a first exemplary semiconductor structure that can be employed in one embodiment of the present application. The first exemplary semiconductor structure shown in FIG. 1 includes a hard mask material stack 12 located on a topmost surface of a semiconductor substrate 10 that can be employed in one embodiment of the present application. The hard mask material stack 12 that is employed in the present application includes, from bottom to top, an oxide hard mask layer 14 and a nitride hard mask layer 16.

In some embodiments of the present application, the semiconductor substrate 10 that can be employed in the present application is a bulk semiconductor substrate. By "bulk" it is meant that the entirety of the semiconductor substrate 10 is composed of at least one semiconductor material. The semiconductor substrate 10 can be comprised of any semiconductor material including, but not limited to, Si, Ge, SiGe, SiC, SiGeC, and III/V compound semiconductors such as, for example, InAs, GaAs, and InP. Multilayers of these semiconductor materials can also be used as the semiconductor material of the bulk semiconductor. In one embodiment, the semiconductor substrate 10 can be comprised of a single crystalline semiconductor material, such as, for example, single crystalline silicon. In other embodiments, the semiconductor substrate 10 may comprise a polycrystalline or amorphous semiconductor material.

In other embodiments of the present application, a semiconductor-on-insulator (SOI) substrate (not specifically shown) can be employed as the semiconductor substrate 10. Although not specifically shown, one skilled in the art understands that an SOI substrate includes a handle substrate, a buried insulator layer located on an upper surface of the handle substrate, and a topmost semiconductor layer located on an upper surface of the buried insulator layer. The handle substrate provides mechanical support for the buried insulator layer and the topmost semiconductor layer. In embodiments in which an SOI substrate is employed, the trench isolation structure that is subsequently formed is processed into the topmost semiconductor layer of the SOI substrate.

The handle substrate and the topmost semiconductor layer of the SOI substrate may comprise the same, or different, semiconductor material. The term "semiconductor" as used herein in connection with the semiconductor material of the handle substrate and the topmost semiconductor layer denotes any semiconductor material including, for example, Si, Ge, SiGe, SiC, SiGeC, and III/V compound semiconductors such as, for example, InAs, GaAs, or InP. Multilayers of these semiconductor materials can also be used as the semiconductor material of the handle substrate and the topmost semiconductor layer. In one embodiment, the handle substrate and the topmost semiconductor layer are both comprised of silicon. In some embodiments, the handle substrate is a non-semiconductor material including, for example, a dielectric material and/or a conductive material. In yet other embodiments, the handle substrate can be omitted and a substrate including an insulator layer and the topmost semiconductor layer can be used as semiconductor substrate 10.

In some embodiments, the handle substrate and the topmost semiconductor layer may have the same or different crystal orientation. For example, the crystal orientation of the handle substrate and/or the topmost semiconductor layer may be {100}, {110}, or {111}. Other crystallographic orientations besides those specifically mentioned can also be used in the present application. The handle substrate and/or the topmost semiconductor layer of the SOI substrate may be a single crystalline semiconductor material, a polycrystalline material, or an amorphous material. Typically, at least the topmost semiconductor layer is a single crystalline semiconductor material. In some embodiments, the topmost semiconductor layer that is located atop the buried insulator layer can be processed to include semiconductor regions having different crystal orientations.

The buried insulator layer of the SOI substrate may be a crystalline or non-crystalline oxide or nitride. In one embodiment, the buried insulator layer is an oxide such as, for example, silicon dioxide. The buried insulator layer may be continuous or it may be discontinuous. When a discontinuous buried insulator region is present, the insulator region exists as an isolated island that is surrounded by semiconductor material.

The SOI substrate may be formed utilizing standard processes including for example, SIMOX (separation by ion implantation of oxygen) or layer transfer. When a layer transfer process is employed, an optional thinning step may follow the bonding of two semiconductor wafers together. The optional thinning step reduces the thickness of the semiconductor layer to a layer having a thickness that is more desirable.

In one example, the thickness of the topmost semiconductor layer of the SOI substrate can be from 100 Å to 1000 Å. In another example, the thickness of the topmost semiconductor layer of the SOI substrate can be from 500 Å to 700 Å. In some embodiments, and when an ETSOI (extremely thin semiconductor-on-insulator) substrate is employed, the semiconductor layer of the SOI has a thickness of less than 100 Å. If the thickness of the topmost semiconductor layer is not within one of the above mentioned ranges, a thinning step such as, for example, planarization or etching can be used to reduce the thickness of the topmost semiconductor layer to a value within one of the ranges mentioned above. The buried insulator layer of the SOI substrate typically has a thickness from 10 Å to 2000 Å, with a thickness from 1000 Å to 1500 Å being more typical. The thickness of the handle substrate of the SOI substrate is inconsequential to the present application.

In some other embodiments, hybrid semiconductor substrates which have different surface regions of different crystallographic orientations can be employed as semiconductor substrate 10. When a hybrid substrate is employed, an nFET is typically formed on a (100) crystal surface, while a pFET is typically formed on a (110) crystal plane. The hybrid substrate can be formed by techniques that are well known in the art. See, for example, U.S. Pat. No. 7,329,923, U.S. Publication No. 2005/0116290, dated Jun. 2, 2005 and U.S. Pat. No. 7,023,055, the entire contents of each are incorporated herein by reference.

Semiconductor substrate 10 may be doped, undoped or contain doped and undoped regions therein. For clarity, the doped regions are not specifically shown in the drawings of the present application. Each doped region within the semiconductor material of the semiconductor substrate 10 may have the same, or they may have different conductivities and/or doping concentrations. The doped regions that are present in the semiconductor material of semiconductor substrate 10 are typically referred to as well regions and they are formed utilizing a conventional ion implantation process or gas phase doping.

Next, hard mask material stack 12 is formed on a topmost surface of the semiconductor substrate 10. As mentioned above, the hard mask material stack 12 that is employed in the present application includes, from bottom to top, an oxide hard mask layer 14 and a nitride hard mask layer 16. As is shown, a bottommost surface of the oxide hard mask layer 14 is in direct physical contact with the topmost surface of the semiconductor substrate 10, while the bottommost surface of the nitride hard mask layer 16 is in direct physical contact with a topmost surface of the oxide hard mask layer 14. By "direct physical contact" it is meant that no other material is present between two contacting materials.

The oxide hard mask layer 14 of the hard mask material stack 12 is a contiguous layer (i.e., unbroken layer) that spans across the entirety of a semiconductor material surface of semiconductor substrate 10. In one embodiment of the present application, the oxide hard mask layer 14 can be a semiconductor oxide such as, for example, silicon oxide. Other dielectric oxides can also be used as the oxide material of the oxide hard mask layer 14. The oxide hard mask layer 14 can be formed utilizing a deposition process including, for example, chemical vapor deposition (CVD), plasma enhanced chemical vapor deposition (PECVD), chemical solution deposition, evaporation, or physical vapor deposition (PVD). Alternatively, the oxide hard mask layer 14 may be formed by thermal oxidation. The thickness of the oxide hard mask layer 14 can range from 5 nm to 100 nm. Other thicknesses that are greater than or lesser than the aforementioned thickness range can also be used for the thickness of the oxide hard mask layer 14.

The nitride hard mask layer 16 is a contiguous layer that spans across the entirety of the topmost surface of the oxide hard mask layer 14. In one embodiment of the present application, the nitride hard mask layer 16 can be silicon nitride. In another embodiment, the nitride hard mask layer 16 can be silicon oxynitride. Other dielectric nitrides can also be used as the nitride material of the nitride hard mask layer 16. The nitride hard mask layer 16 can be formed utilizing a deposition process including, for example, chemical vapor deposition (CVD), plasma enhanced chemical vapor deposition (PECVD), chemical solution deposition, evaporation, or physical vapor deposition (PVD). Alternatively, the nitride hard mask layer 16 may be formed by thermal nitridation. The thickness of the nitride hard mask layer 16 can range from 5 nm to 100 nm. Other thicknesses that are greater than or lesser than the aforementioned thickness range can also be used for the thickness of the nitride hard mask layer 16.

Figure 2:
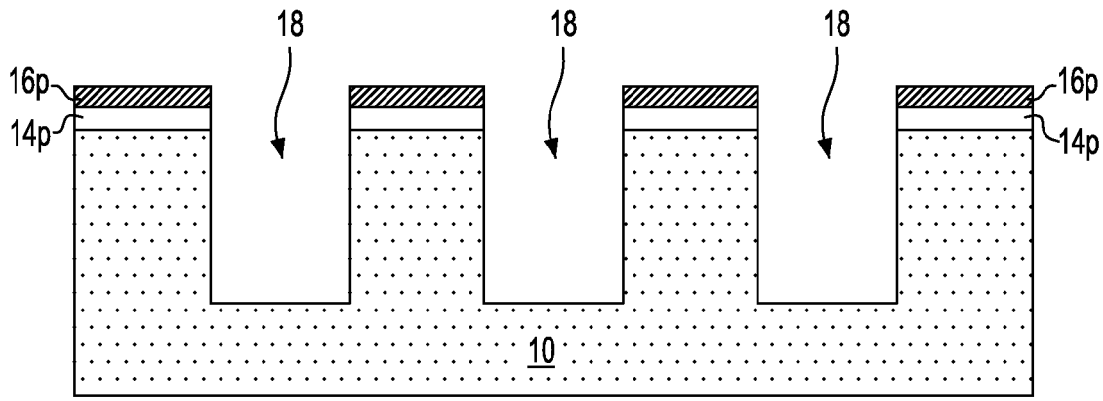
FIG. 2 is a vertical cross sectional view of the first exemplary semiconductor structure of FIG. 1 after forming at least one opening entirely through the hard mask material stack and into a portion of the semiconductor substrate.

Referring now to FIG. 2, there is illustrated the first exemplary semiconductor structure of FIG. 1 after forming at least one opening 18 through the entirety of the hard mask material stack 12 and into a portion of the semiconductor substrate 10. As shown, the at least one opening 18 extends entirely through the nitride hard mask layer 16 and entirely through the oxide hard mask layer 14 and partially into, but not completely through, the semiconductor substrate 10. Instead, a bottommost surface of each opening 18 stops on a semiconductor material sub-surface of the semiconductor substrate 10. By "semiconductor material sub-surface" it is meant a semiconductor material surface of the semiconductor substrate 10 that is located between the topmost surface of the semiconductor substrate 10 and the bottommost surface of the semiconductor substrate 10. In one embodiment of the present application, the depth of each opening 18 that is formed into the semiconductor substrate 10, as measured from the topmost surface of the semiconductor substrate 10 to the exposed sub-surface of the semiconductor substrate 10, is from 50 nm to 200 nm. Other depths that are greater than or less than the aforementioned depth range may also be employed in the present application. The oxide hard mask layer that remains after the patterning process may be referred to herein as oxide hard mask portions 14p, while the nitride hard mask layer that remains after the patterning process may be referred to herein as nitride hard mask portions 16p.

Each opening 18 that is formed into the semiconductor substrate 10 exposes semiconductor sidewalls and a semiconductor material sub-surface of the semiconductor substrate 10. In one embodiment of the present application, the exposed sidewalls of the semiconductor substrate 10 provided by each opening 18 may be perpendicular to the topmost and bottommost surfaces of the semiconductor substrate 10. In another embodiment of the present application, the exposed sidewalls of the semiconductor substrate 10 provided by each opening 18 may have some tapering associated therewith such that the width of each opening 18 decreases from the topmost surface of the semiconductor substrate 10 to the exposed semiconductor material sub-surface of the semiconductor substrate 10. The semiconductor material sub-surface of the semiconductor substrate 10 that is exposed is parallel to the topmost and bottommost surfaces of the semiconductor substrate 10.

The at least one opening 18 can be formed by lithography and etching. Lithography can include forming a photoresist (not shown) on the topmost surface of the nitride hard mask layer 16, exposing the photoresist to a desired pattern of radiation, and then developing the exposed photoresist with a conventional resist developer to provide a patterned photoresist atop the nitride hard mask layer 16. At least one etch is then employed which transfers the pattern from the patterned photoresist into the hard mask material stack 12 (i.e., the nitride hard mask layer 16 and the oxide hard mask layer 14) and then into the semiconductor substrate 10. In one embodiment, the etch used for pattern transfer may include a dry etch process such as, for example, reactive ion etching, plasma etching, ion beam etching or laser ablation. After pattern transfer, the patterned photoresist can be removed from the structure utilizing a conventional resist stripping process such as, for example, ashing.

Figure 3:
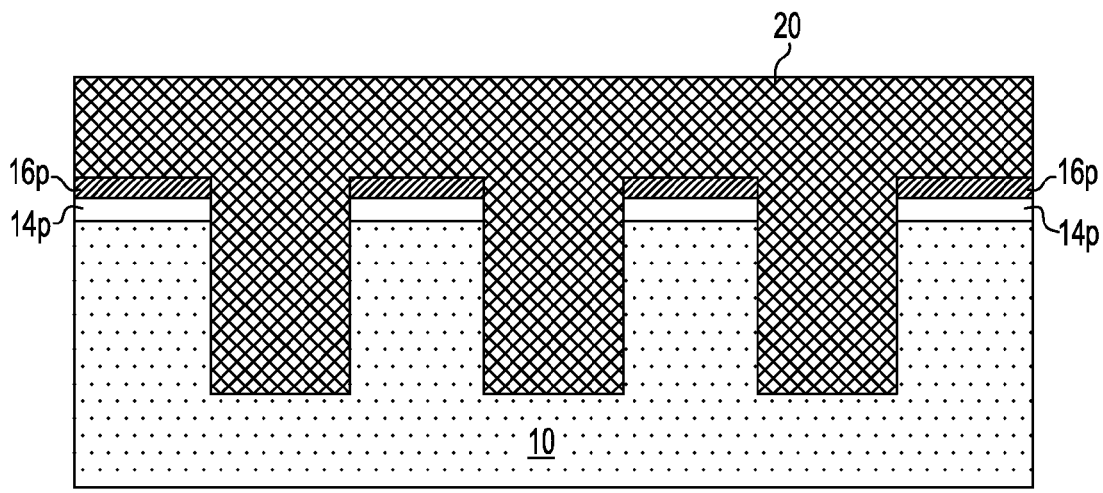
FIG. 3 is a vertical cross sectional view of the first exemplary semiconductor structure of FIG. 2 after forming a trench dielectric oxide material.

Referring now to FIG. 3, there is illustrated the first exemplary semiconductor structure of FIG. 2 after forming a trench dielectric oxide material 20. The trench dielectric oxide material 20 completely fills each opening 18 and spills onto the topmost surface of each nitride hard mask portion 16p. As is illustrated, a bottom portion of the trench dielectric oxide material 20 is in directly physical contact with the exposed semiconductor sidewalls and the semiconductor material sub-surface of the semiconductor substrate 10, a middle portion of the trench dielectric oxide material 20 is in direct physical contact with sidewalls of the oxide hard mask portions 14p and the nitride hard mask portions 16p, and a topmost portion of the trench dielectric oxide material 20 has a bottommost surface that is in direct physical contact with a topmost surface of each nitride hard mask portion 16p.

In one embodiment of the present application, the trench dielectric oxide 20 comprises silicon oxide that is formed by chemical vapor deposition in which TEOS (Tetraethyl-orthosilicate) is used as the precursor. In one embodiment, the TEOS can be deposited at a temperature from 400° C. to 660° C. Other types of precursors as well as other types of dielectric oxides can also be employed as the trench dielectric oxide material 20. For example, HARP™ from AMAT can be used as a trench dielectric oxide material 20.

Figure 4:
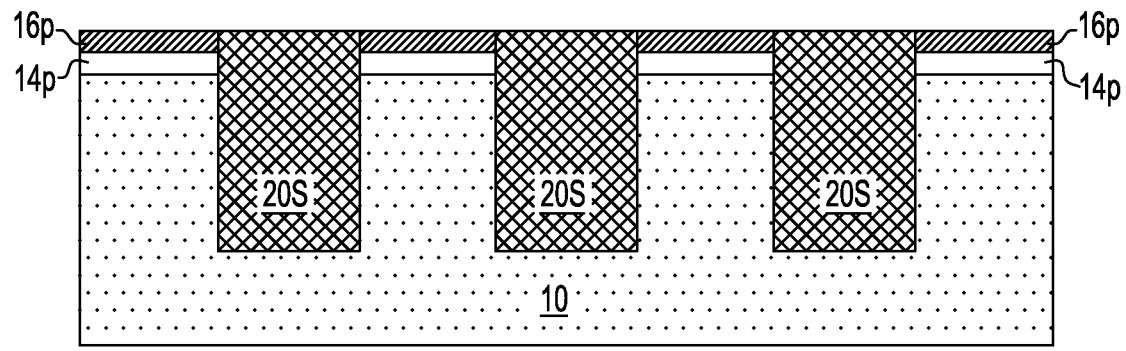
FIG. 4 is a vertical cross sectional view of the first exemplary semiconductor structure of FIG. 3 after performing a planarization process to provide a trench isolation structure.

Referring now to FIG. 4, there is illustrated the first exemplary semiconductor structure of FIG. 3 after performing a planarization process to provide a trench isolation structure 20S within the opening 18 utilizing the nitride hard mask portions 16p as a planarization/polishing stop layer. The trench isolation structure 20S includes remaining portions of the trench dielectric oxide material 20 mentioned above. The size and pitch of the trench isolation structure 20S can be designed to provide a specific device size and location. By changing the size and pitch of the trench isolation structure, one can change the device size and location. Planarization may be performed by chemical mechanical polishing (CMP) and/or grinding utilizing the nitride hard mask portions 16p. At this point of the present application and as is shown in FIG. 4, the topmost surface of trench isolation structure 20S is coplanar with a topmost surface of the nitride hard mask portions 16p.

Figure 5:
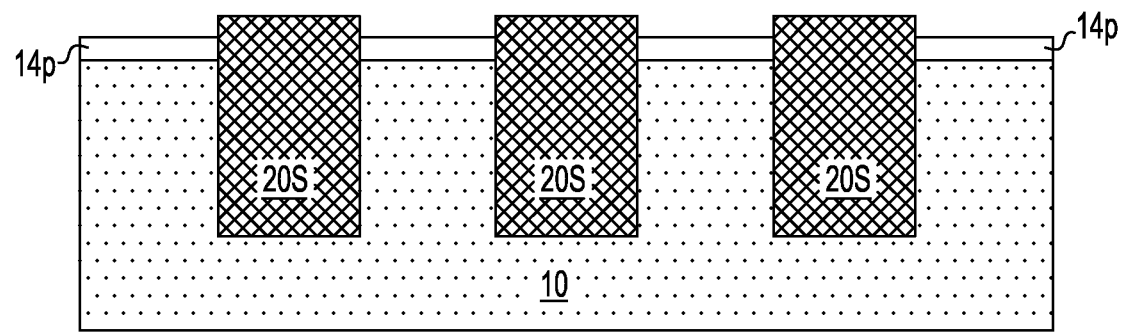
FIG. 5 is a vertical cross sectional view of the first exemplary semiconductor structure of FIG. 4 after remove remaining portions of the nitride hard mask layer of the hard mask material stack to expose remaining portions of the oxide hard mask layer.

Referring now to FIG. 5, there is illustrated the first exemplary semiconductor structure of FIG. 4 after remove remaining portions of the nitride hard mask layer (i.e., nitride hard mask portions 16p) to expose remaining portions of the oxide hard mask layer (i.e., oxide hard mask portions 14p). After this removal step of the present application, the topmost surface of the trench isolation structure 20S protrudes above the exposed topmost surfaces of each oxide hard mask portions 14p.

The removal of the nitride hard mask portions 16p from the first exemplary structure shown in FIG. 4 can be performed utilizing an anisotropic etching process that selectivity removes the nitride material forming the nitride hard mask portions 16p as compared to oxide forming both the oxide hard mask portions 14p and the trench isolation structure 20S. In one example, the nitride hard mask portions 16p can be removed from the topmost surface of the oxide hard mask portions 14p by utilizing hot phosphoric acid.

Figure 6:
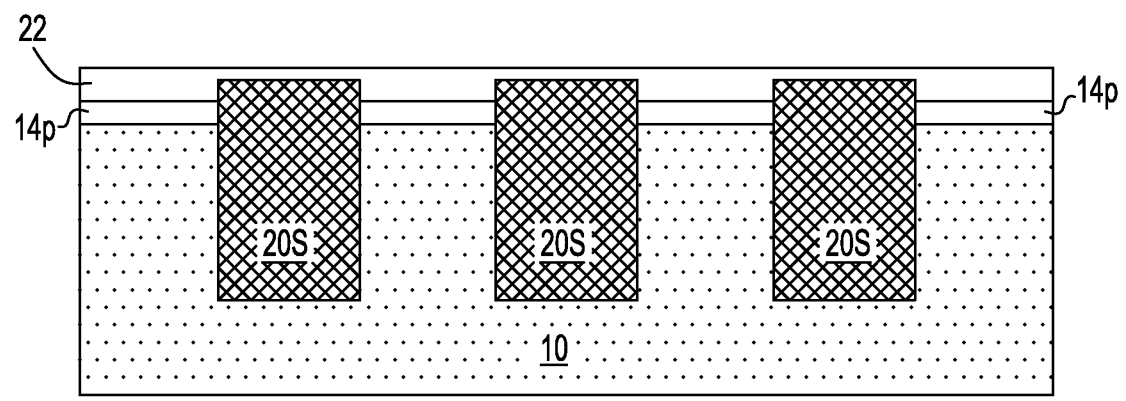
FIG. 6 is a vertical cross sectional view of the first exemplary semiconductor structure of FIG. 5 after formation of a screen oxide layer on the remaining portions of the oxide hard mask layer and atop the trench isolation structure.

Referring now to FIG. 6, there is illustrated the first exemplary semiconductor structure of FIG. 5 after formation of a screen oxide layer 22 on the remaining portions of the oxide hard mask layer (i.e., the oxide hard mask portions 14p) and atop the trench isolation structure 20S.

In one embodiment of the present application, the screen oxide layer 22 may be comprised of same oxide as that of the oxide hard mask portions 14p and the trench isolation structure 20S and, as such, no interface is present between these materials. For example, the screen oxide layer 22, the oxide hard mask portions 14p and the trench isolation structure 20S may be comprised of silicon oxide. The screen oxide layer 22 may be formed by a thermal oxidation process or any deposition process including, for example, chemical vapor deposition or plasma enhanced chemical vapor deposition.

In some embodiments, the screen oxide layer 22 has a thickness from 5 nm to 100 nm. Other thicknesses that are greater than or lesser than the aforementioned thickness range can also be used for the thickness of the screen oxide layer 22.

Figure 7:
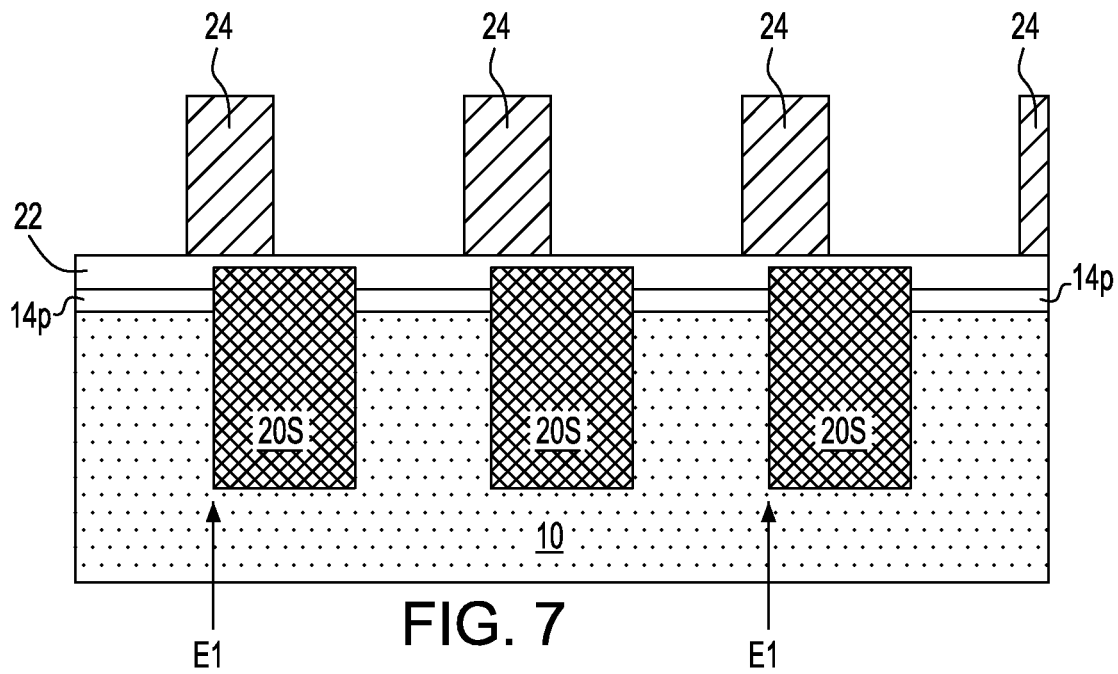
FIG. 7 is a vertical cross sectional view of the first exemplary semiconductor structure of FIG. 6 after forming a mandrel structure having a bottommost surface that straddles a sidewall edge of the underlying trench isolation structure.

Referring now to FIG. 7, there is illustrated the first exemplary semiconductor structure of FIG. 6 after forming a mandrel structure 24 on the surface of the screen oxide layer 22. Each mandrel structure 24 has a bottommost surface that straddles a sidewall edge E1 of the underlying trench isolation structure 20S. Thus, a first portion of each mandrel structure 24 (i.e., left hand side of each mandrel structure 24 in the drawings) is located atop a portion of the screen oxide layer 22 that is present over a non-etched portion of the semiconductor substrate 10, while a second portion of each mandrel structure 24 (i.e., right hand side of each mandrel structure 24 in the drawings) is located atop another portion of the screen oxide layer 22 that is present over the trench isolation structure 20S. In some embodiments, the first portion and the second portion of each mandrel structure 24 may have a same area. In other embodiments, the first portion and the second portion of each mandrel structure 24 may have a different area.

Each mandrel structure 24 can be formed by deposition of a layer of mandrel material and then patterning the layer of mandrel material via lithography and etching. In one embodiment of the present application, the layer of mandrel material that forms the mandrel structure 24 may comprise amorphous silicon. In another embodiment of the present application, the layer of mandrel material that forms the mandrel structure 24 may be an organic self-planarizing material such as, for example, a spin-on glass (SOG) or a spin-on low-k dielectric material such as SiLK™ from DOW Chemicals; the term low-k denotes a dielectric material having a dielectric constant less than silicon oxide.

In one embodiment, the layer of mandrel material that forms the mandrel structure 24 can be formed utilizing a deposition process including, for example, chemical vapor deposition (CVD), plasma enhanced chemical vapor deposition (PECVD), evaporation or spin-on coating. The thickness of the layer of mandrel material that forms the mandrel structure 24 that can be employed in the present application may vary depending on the type of mandrel material employed as well as the method that was employed in forming the same. In one embodiment, the layer of mandrel material that forms the mandrel structure 24 has a thickness from 80 nm to 500 nm. Other thicknesses that are greater or lesser than the range provided above can also be used for the layer of mandrel material that forms the mandrel structure 24.

As mentioned above, the layer of mandrel material that forms the mandrel structure 24 is then subjected to a patterning step which includes lithography and etching. The dimensions of each mandrel structure 24 are limited only by lithography. Each mandrel structure 24 that is formed can have a width from 30 nm to 100 nm, and the distance between a central point of one mandrel structure 24 to a central portion of another mandrel structure 24 (which distance may be referred to herein as a pitch) can be from 50 nm to 100 nm. Other widths and pitches can also be employed in the present application.

Each mandrel structure 24 that is formed has substantially vertical sidewalls. By "substantial vertical sidewalls" it is meant that the sidewalls of each mandrel structure is from 85° to 90°. In some embodiments, each mandrel structure 24 has sidewalls that are entirely perpendicular, i.e., entirely vertical (90°), to the topmost surface of the semiconductor substrate 10. In other embodiments, the sidewalls of each mandrel structure 24 may be tapered.

Figure 8:
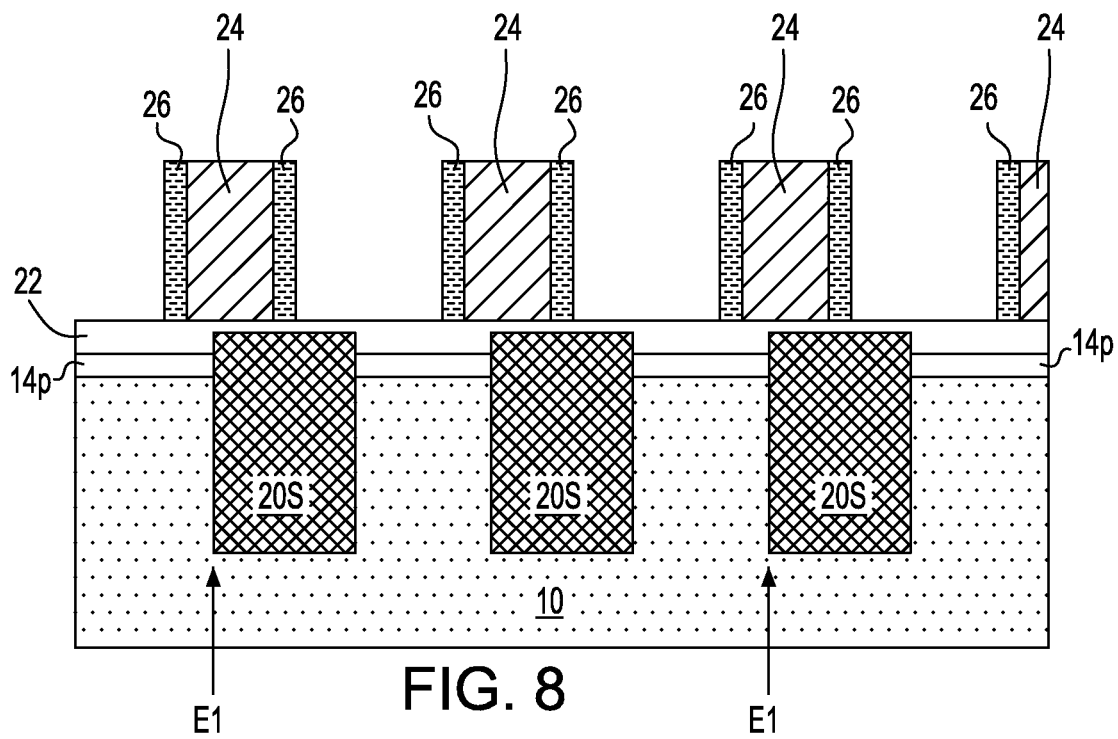
FIG. 8 is a vertical cross sectional view of the first exemplary semiconductor structure of FIG. 7 after formation of a nitride spacer on each exposed sidewall of the mandrel structure.

Referring now to FIG. 8, there is illustrated the first exemplary semiconductor structure of FIG. 7 after formation of a nitride spacer 26 on each exposed sidewall of each mandrel structure 24. Thus, a pair of nitride spacers 26 is formed on the exposed sidewalls of each mandrel structure as shown, for example, in FIG. 8.

The nitride spacers 26 can be formed by deposition of a dielectric nitride spacer material, followed by an etching process such as, for example, RIE. The dielectric nitride spacer material that can be used in providing nitride spacers 26 includes for example, a dielectric nitride, and/or a dielectric oxynitride. In one example, the dielectric nitride spacer material used in providing the nitride spacers 26 may be composed of silicon nitride and/or silicon oxynitride. The dielectric nitride spacer material can be provided by a deposition process including, for example, chemical vapor deposition (CVD), plasma enhanced chemical vapor deposition (PECVD), or physical vapor deposition (PVD).

Each nitride spacer 26 includes a first sidewall surface that is in direct physical contact with a sidewall of a mandrel structure 24, and a second sidewall surface that is bare. Each nitride spacer 26 also has a topmost surface that that is coplanar with a topmost surface of the mandrel structure 24; the nitride spacers 26 however are not formed on the topmost surface of each mandrel structure 24. Instead, the topmost surface of each mandrel structure 24 remains bare, i.e., is exposed, at this point of the present application. A bottommost surface of each nitride spacer 26 is located on a topmost surface of the screen oxide layer 22. Both sidewalls of each nitride spacer 26 are substantially vertical to the topmost surface of the semiconductor substrate 10.

Each nitride spacer 26 typically has a width, as measured from the first sidewall surface to the second sidewall surface, of from 10 nm to 30 nm, with a from 18 nm to 23 nm being more typical. The width of each nitride spacers 26 will determine the width of the semiconductor fins which will be subsequently formed in the area now occupied by the nitride spacers 26 that are located directly above the semiconductor substrate 10.

Figure 9:
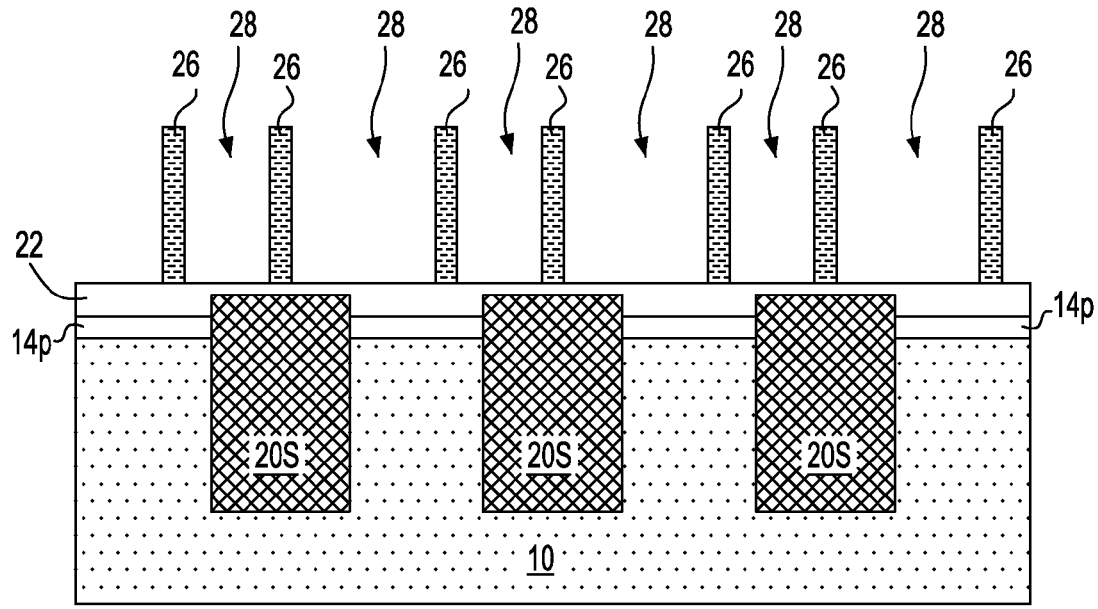
FIG. 9 is a vertical cross sectional view of the first exemplary semiconductor structure of FIG. 8 after removing the mandrel structure.

Referring now to FIG. 9, there is illustrated the first exemplary semiconductor structure of FIG. 8 after removing the mandrel structure 24; the nitride spacers 26 remain. Gaps 28 are located between the remaining nitride spacers 26. The gaps 28 have different sizes. Notably, the gaps between a corresponding pair of nitride spacers 26 that previously surrounded a particular mandrel structure are smaller, than the gaps between nitride spacers located on different mandrel structures 24. The removal of each mandrel structure 24 is performed utilizing an etching process that selectively removes the mandrel material relative to the nitride spacers 26 and the screen oxide layer 22. In one embodiment, an anisotropic etching process can be used to selectively remove each mandrel structure 24. In one example, each mandrel structure 24 can be removed utilizing an HBr—$O_2$ plasma etch.

Figure 10:
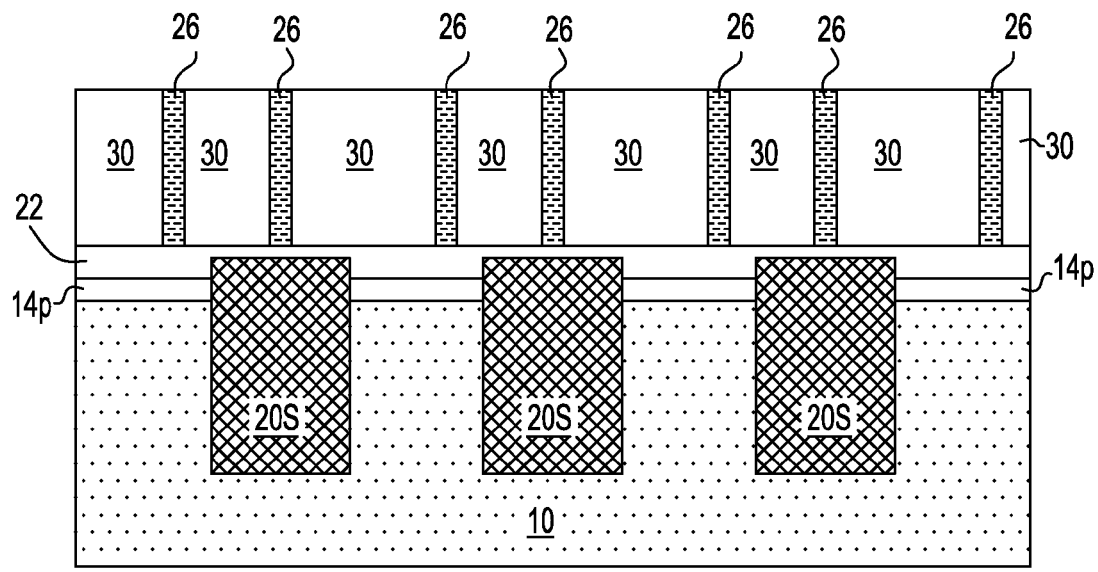
FIG. 10 is a vertical cross sectional view of the first exemplary semiconductor structure of FIG. 9 after forming a dielectric oxide material having a topmost surface that is coplanar with a topmost surface of the nitride spacers.

Referring now FIG. 10, there is illustrated the first exemplary semiconductor structure of FIG. 9 after forming a dielectric oxide material 30 having a topmost surface that is coplanar with a topmost surface of the nitride spacers 26. As is shown, the dielectric oxide material 30 completely fills each gap 28. As is also shown, the topmost surface of each nitride spacer 36 is exposed after formation of the dielectric oxide material 30.

In one embodiment, the dielectric oxide material 30 may include a same oxide as the trench dielectric oxide materials 20. In another embodiment, the dielectric oxide material 30 may include a different oxide as the trench dielectric oxide material 20. Typically, the dielectric oxide material 30, the screen oxide layer 22 and the trench dielectric oxide material 20 all comprise silicon oxide.

In one embodiment of the present application, the dielectric oxide material 30 comprises silicon oxide that is formed by chemical vapor deposition in which TEOS (Tetraethylorthosilicate) is used as the precursor. In one embodiment, the TEOS can be deposited at a temperature from 400° C. to 660° C.

In some embodiments of the present application, a planarization process such as chemical mechanical polishing, may be performed to remove any excess dielectric oxide material 30 that forms on the topmost surface of the nitride spacers 26.

Figure 11:
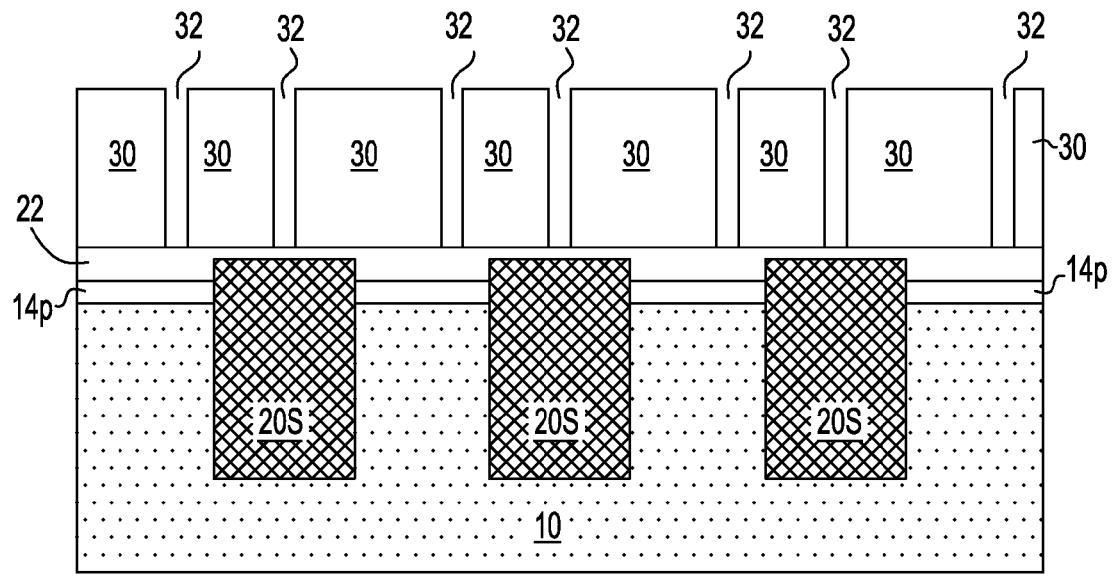
FIG. 11 is a vertical cross sectional view of the first exemplary semiconductor structure of FIG. 10 after removing the nitride spacers to form cavities in the dielectric oxide material.

Referring now to FIG. 11, there is illustrated the first exemplary semiconductor structure of FIG. 10 after removing the nitride spacers 26. The removal of nitride spacers forms cavities 32 within the dielectric oxide material 30. Each cavity 32 has a width that is the same as that of the nitride spacer 26 that was removed, and each cavity 32 exposes a portion of the screen oxide layer 22. The nitride spacers 26 can be removed utilizing an anisotropic etching process that selectively removes the nitride material of each nitride spacer 26 relative to oxide. In one example, hot phosphoric acid can be used to remove the nitride spacers 26.

Figure 12:
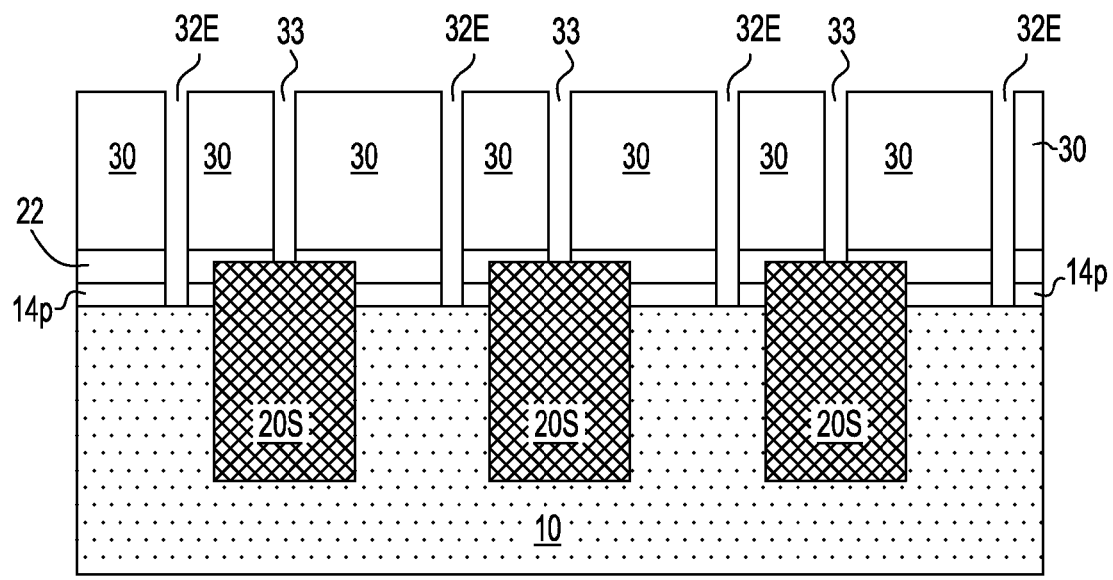
FIG. 12 is a vertical cross sectional view of the first exemplary semiconductor structure of FIG. 11 after forming an extended cavity that exposes a topmost surface of the semiconductor substrate, and another extended cavity that exposes a topmost surface of the trench isolation structure.

Referring now to FIG. 12, there is illustrated the first exemplary semiconductor structure of FIG. 11 after forming an extended cavity 32E that exposes a topmost surface of the semiconductor substrate, and another extended cavity 33 that exposes a topmost surface of the trench isolation structure 20S. Notably, this step of the present application opens the screen oxide layer 22 and, if present, the oxide hard mask portions 14p via an etching process. In one embodiment of the present application, a reactive ion etch may be used to form the extended cavities 32E, 33.

Figure 13:
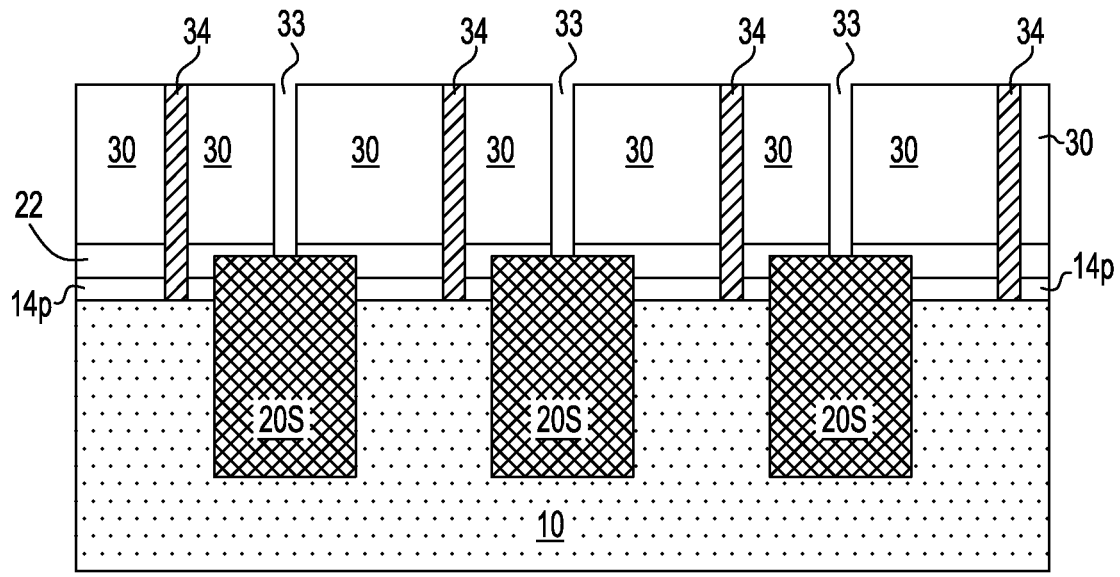
FIG. 13 is a vertical cross sectional view of the first exemplary semiconductor structure of FIG. 12 after epitaxial growing a semiconductor fin within the extended cavities and only on an exposed topmost surface of the semiconductor substrate.

Referring now to FIG. 13, there is illustrated the first exemplary semiconductor structure of FIG. 12 after epitaxial growing a semiconductor fin 34 within each extended cavities 32E that exposes a topmost surface of the semiconductor substrate 10; semiconductor fins do not form on the topmost surface of the trench isolation structures 20S within extended cavity 33 or on any portion of the dielectric oxide material 30. Instead, each semiconductor fin 34 is formed within each extended cavity 32E by a bottom-up epitaxial growth process from the exposed topmost surface of the semiconductor substrate 10. As such, each semiconductor fin 34 has an epitaxial relationship with that of the underlying topmost surface of the semiconductor substrate 10 and a self-aligned nature to the isolation region previously generated.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatuses that are suitable for use in forming the semiconductor fins 34 include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition process for forming the semiconductor fins typically ranges from 550° C. to 900° C. Although higher temperature typically results in faster deposition, the faster deposition may result in crystal defects and film cracking.

A number of different sources may be used for the deposition of the semiconductor fins 34. In some embodiments, the gas source for the deposition of epitaxial semiconductor material may include a silicon containing gas source, a germanium containing gas source, or a combination thereof. For example, an epitaxial Si fin may be deposited from a silicon containing gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium fin can be deposited from a germanium containing gas source that is selected from the group consisting of germane, digermane, halogermane, dichlorogermane, trichlorogermane, tetrachlorogermane and combinations thereof. While an epitaxial silicon germanium alloy fin can be formed utilizing a combination of such gas sources. Carrier gases like hydrogen, nitrogen, helium and argon can be used.

In some embodiments, the entire extended cavity 32E is formed with a single semiconductor material forming semiconductor fins 34 consisting of one semiconductor material. In other embodiments, each semiconductor fin 34 may include a least two different semiconductor materials, i.e., Si and SiGe, stacked one atop the other.

In yet other embodiments, block mask technology may be used such that some of the extended cavities 32E are protected with a first block mask, while other extended cavities 32E are not. This can permit the formation of a first set of semiconductor fins that comprise a first semiconductor material (i.e., Si) in the areas of the structure not including the first block mask. The first block mask can then be removed and then a second block mask can be formed in areas in which the first set of semiconductor fins were formed. With the second block mask in place, a second set of semiconductor fins that comprise a second semiconductor material that is different from the first semiconductor material can be formed in the areas of the structure not including the second block mask. The second block mask can then be removed.

Notwithstanding which embodiment is employed, each semiconductor fin 34 has topmost surface that is coplanar with a topmost surface of the dielectric oxide material 30, and each semiconductor fin 34 has a width that is the same as the width of the nitride spacers 26. As is shown, each semiconductor fin 34 has sidewalls that are direct physical contact with sidewalls of the dielectric oxide material 30, the screen oxide layer 22 and, if present, the oxide hard mask portions 14p.

Figure 14:
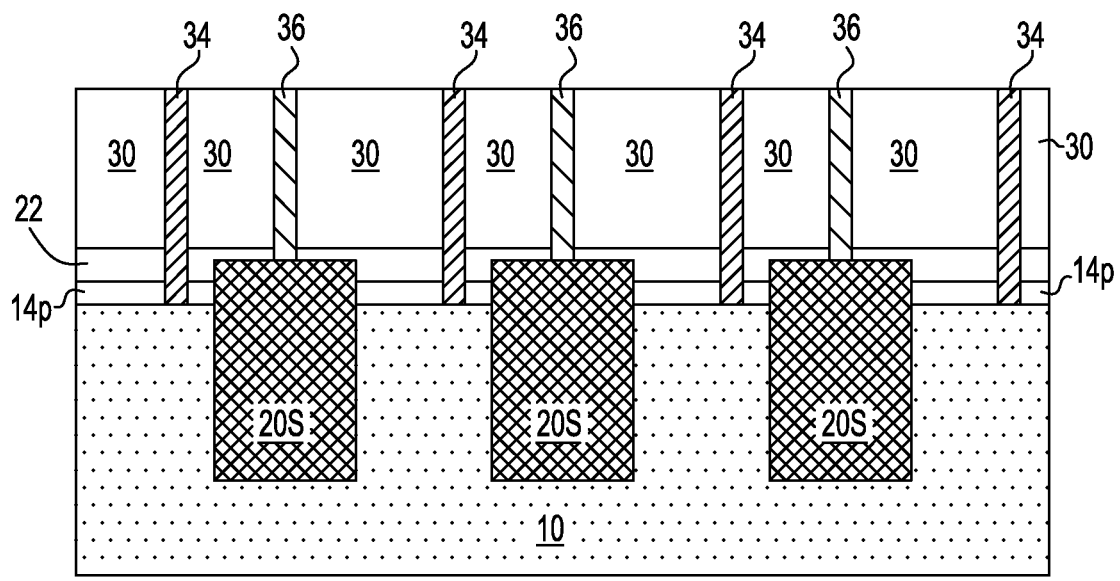
FIG. 14 is a vertical cross sectional view of the first exemplary semiconductor structure of FIG. 13 after filling remaining extended cavities located atop the trench isolation structure with another dielectric oxide material.

Referring now to FIG. 14, there is illustrated the first exemplary semiconductor structure of FIG. 13 after completely filling the extended cavities 33 located atop the trench isolation structure 20S with another dielectric oxide material 36.

In one embodiment, the another dielectric oxide material 36 may include a same oxide as the dielectric oxide material 30. In another embodiment, the another dielectric oxide material 36 may include a different oxide as the dielectric oxide material 30. Typically, the dielectric oxide material 30 and the another dielectric oxide 36 each comprise silicon oxide.

In one embodiment of the present application, the another dielectric oxide material 36 comprises silicon oxide that is formed by chemical vapor deposition in which TEOS (Tetra-ethyl-orthosilicate) is used as the oxide precursor. In one embodiment, the TEOS can be deposited at a temperature from 400° C. to 660° C. In some embodiments, a planarization process can be used to provide the planar structure shown in FIG. 14.

The structure shown in FIG. 14 can now be processed used any conventional finFET process flow that is well known to those skilled in the art. The finFET processes would begin by first recessing the dielectric oxide material 30 and another dielectric oxide 36 to expose at least a portion of each semiconductor fin 34. A gate first or a gate last process may then be performed to form a finFET structure.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, said method comprising:
   providing a trench isolation structure in a semiconductor substrate;
   forming a mandrel structure having a first portion located above said semiconductor substrate and a second portion located above said trench isolation structure, wherein a bottommost surface of said mandrel structure straddles a sidewall edge of said trench isolation structure;

forming a nitride spacer on each sidewall of said mandrel structure;

removing said mandrel structure selective to said nitride spacers;

forming a dielectric oxide material having a topmost surface that is coplanar with a topmost surface of said nitride spacers;

removing one of nitride spacers to provide a cavity exposing a portion of a topmost surface of said semiconductor substrate and another of said nitride spacers to provide another cavity exposing a portion of a topmost surface of said trench isolation structure; and epitaxially growing a semiconductor fin in said cavity that exposes said portion of said topmost surface of said semiconductor substrate, but not in said another cavity that exposes said portion of said topmost surface of said trench isolation structure, wherein a bottommost surface of said semiconductor fin directly contacts an exposed portion of said topmost surface of said semiconductor substrate.

2. The method of claim 1, wherein said providing said trench isolation structure in said semiconductor substrate comprises:

forming a hard mask material stack on said topmost surface of said semiconductor substrate;

forming a patterned photoresist on a topmost surface of said hard mask material stack;

etching an opening entirely through said hard mask material stack and partially through said semiconductor substrate;

depositing a trench dielectric oxide material in said opening and on said topmost surface of said hard mask material stack; and removing said trench dielectric oxide material on said topmost surface of said hard mask material stack by planarization.

3. The method of claim 2, wherein said hard mask stack comprises, from bottom to top, an oxide hard mask layer and a nitride hard mask layer, and remaining portions of said nitride hard mask layer that are provided after etching said opening serve as an planarization stop layer.

4. The method of claim 3, wherein said remaining portions of said nitride hard mask layer are removed after said planarization to expose remaining portions of said oxide hard mask layer.

5. The method of claim 4, further comprising forming a screen oxide layer directly on a topmost surface of each remaining portion of said oxide hard mask layer and directly on said topmost surface of said trench isolation structure.

6. The method of claim 5, wherein said bottommost surface of said mandrel structure is located on said screen oxide layer.

7. The method of claim 1, wherein said forming said mandrel structure comprises:

depositing a layer of mandrel material; and patterning said layer of mandrel material by lithography and etching.

8. The method of claim 7, wherein said layer of mandrel material comprises amorphous silicon.

9. The method of claim 7, wherein said layer of mandrel material comprises an organic self-planarizing material.

10. The method of claim 1, wherein said forming said nitride spacer on each sidewall of said mandrel structure comprises:

depositing a nitride dielectric material; and etching said nitride dielectric material.

11. The method of claim 1, wherein said removing said mandrel structure selective to said nitride spacers comprises an anisotropic etch.

12. The method of claim 1, wherein said forming said dielectric oxide material having said topmost surface that is coplanar with said topmost surface of said nitride spacers comprises;

depositing said dielectric oxide material; and removing portions of said dielectric oxide material that are disposed atop said nitride spacers by planarization.

13. The method of claim 1, wherein said semiconductor fin comprise a same semiconductor material as said semiconductor substrate.

14. The method of claim 1, wherein said semiconductor fin comprise a different semiconductor material as said semiconductor substrate.

15. The method of claim 1, further comprises filling said another cavity with another dielectric oxide material.

16. A method of forming a semiconductor structure, said method comprising:

providing a structure including a hard mask material stack comprising from bottom to top, an oxide hard mask layer and a nitride hard mask layer on a topmost surface of a semiconductor substrate;

forming an opening entirely through said hard mask material stack and partially through said semiconductor substrate;

providing a trench isolation structure in said opening, wherein said trench isolation structure has a topmost surface that is coplanar with a topmost surface of remaining portions of said nitride hard mask layer;

removing said remaining portion of said nitride hard mask layer to expose remaining portions of said oxide hard mask layer;

forming a screen oxide layer on each of said remaining portions of said oxide hard mask layer and said topmost surface of said trench isolation structure;

forming a mandrel structure on said screen oxide layer and having a first portion located above said semiconductor substrate and a second portion located above said trench isolation structure, wherein a bottommost surface of said mandrel structure straddles a sidewall edge of said trench isolation structure;

forming a nitride spacer on each sidewall of said mandrel structure;

removing said mandrel structure selective to said nitride spacers;

forming a dielectric oxide material having a topmost surface that is coplanar with a topmost surface of said nitride spacers;

removing one of nitride spacers to provide a cavity exposing a portion of said screen oxide layer located above said topmost surface of said semiconductor substrate and another of said nitride spacers to provide another cavity exposing another portion of said screen oxide layer located above said topmost surface of said trench isolation structure;

extending said cavity to expose said topmost surface of said semiconductor substrate, and said another cavity to expose said topmost surface of said trench isolation structure; and epitaxially growing a semiconductor fin in said cavity that exposes said portion of said topmost surface of said semiconductor substrate, but not in said another cavity that exposes said portion of said topmost surface of said trench isolation structure, wherein a bottommost surface of said semiconductor fin directly contacts an exposed portion of said topmost surface of said semiconductor substrate.

17. The method of claim 16, wherein said forming said opening entirely through said hard mask material stack and partially through said semiconductor substrate comprises lithography and etching.

18. The method of claim 16, wherein said forming said mandrel structure comprises:
   depositing a layer of mandrel material; and
   patterning said layer of mandrel material by lithography and etching.

19. The method of claim 16, further comprises filling said another cavity with another dielectric oxide material.

20. The method of claim 1, wherein said bottommost surface of said semiconductor fin is located beneath said topmost surface of said trench isolation structure.

\* \* \* \* \*